United States Patent
Liu et al.

(10) Patent No.: US 8,570,516 B2
(45) Date of Patent: *Oct. 29, 2013

(54) INFRARED DIRECT ILLUMINATION MACHINE VISION TECHNIQUE FOR SEMICONDUCTOR PROCESSING EQUIPMENT

(75) Inventors: Gang Liu, Natick, MA (US); Lei Wang, Wayland, MA (US)

(73) Assignee: Cognex Corporation, Natick, MA (US)

( * ) Notice: Subject to any disclaimer, the term of this patent is extended or adjusted under 35 U.S.C. 154(b) by 305 days.

This patent is subject to a terminal disclaimer.

(21) Appl. No.: 12/977,229

(22) Filed: Dec. 23, 2010

(65) Prior Publication Data

US 2011/0157352 A1   Jun. 30, 2011

Related U.S. Application Data

(63) Continuation-in-part of application No. 12/209,248, filed on Sep. 12, 2008, now Pat. No. 8,189,194.

(51) Int. Cl.
*G01B 11/00* (2006.01)

(52) U.S. Cl.
USPC ...... 356/399; 356/401; 356/237.2; 356/237.5

(58) Field of Classification Search
USPC .................................. 356/399, 237.2–237.5
See application file for complete search history.

(56) References Cited

U.S. PATENT DOCUMENTS

| | | | |
|---|---|---|---|
| 4,076,420 A | 2/1978 | De Maeyer et al. | |
| 4,238,780 A | 12/1980 | Doemens | |
| 4,391,505 A * | 7/1983 | Silverberg | 399/372 |
| 4,571,058 A * | 2/1986 | Lehman | 399/217 |
| 4,697,075 A | 9/1987 | Roos et al. | |
| 4,714,347 A | 12/1987 | Cole | |
| 4,803,735 A | 2/1989 | Nishida et al. | |
| 4,924,086 A | 5/1990 | Webber | |
| 4,969,037 A | 11/1990 | Poleschinski et al. | |
| 5,048,094 A | 9/1991 | Aoyama et al. | |
| 5,365,672 A | 11/1994 | Kato | |
| 5,367,439 A | 11/1994 | Mayer et al. | |

(Continued)

FOREIGN PATENT DOCUMENTS

JP   2006073603   3/2006

OTHER PUBLICATIONS

"Illumination Structure Solves Multitudes of Applications"; Illumination Technologies; http://www.illuminationtech.com/WhitePapers.html; 2001.

(Continued)

*Primary Examiner* — Tarifur Chowdhury
*Assistant Examiner* — Isiaka Akanbi
(74) *Attorney, Agent, or Firm* — Quarles & Brady LLP

(57) ABSTRACT

A vision system is provided to determine a positional relationship between a semiconductor wafer on a platen and an element on a processing machine, such as a printing screen, on a remote side of the semiconductor wafer from the platen. A source directs infrared light through an aperture in the platen to illuminate the semiconductor wafer and cast a shadow onto the element adjacent an edge of the semiconductor wafer. A video camera produces an image using light received from the platen aperture, wherein some of that received light was reflected by the wafer. The edge of the semiconductor wafer in the image is well defined by a dark/light transition.

19 Claims, 1 Drawing Sheet

(56) References Cited

U.S. PATENT DOCUMENTS

| | | |
|---|---|---|
| 5,371,690 A | 12/1994 | Engel et al. |
| 5,381,004 A | 1/1995 | Uritsky et al. |
| 5,497,007 A | 3/1996 | Uritsky et al. |
| 5,585,917 A | 12/1996 | Woite et al. |
| 5,659,396 A | 8/1997 | Mondie |
| 5,739,913 A | 4/1998 | Wallace |
| 5,835,223 A | 11/1998 | Zwerner et al. |
| 5,953,130 A | 9/1999 | Benedict et al. |
| 5,978,081 A | 11/1999 | Michael et al. |
| 5,982,132 A | 11/1999 | Colby |
| 6,025,905 A | 2/2000 | Sussman |
| 6,166,505 A | 12/2000 | Sato |
| 6,166,808 A | 12/2000 | Greve |
| 6,170,973 B1 | 1/2001 | Benedict |
| 6,191,850 B1 | 2/2001 | Chiang |
| 6,275,742 B1 | 8/2001 | Sagues et al. |
| 6,341,878 B1 | 1/2002 | Chiang |
| 6,900,877 B2 | 5/2005 | Raaijmakers |
| 6,914,679 B2 | 7/2005 | Nettekoven et al. |
| 6,933,172 B2 | 8/2005 | Tomimatsu |
| 7,042,568 B2 | 5/2006 | Mayo |
| 7,048,400 B2 | 5/2006 | Murasko et al. |
| 7,106,425 B1 | 9/2006 | Bultman et al. |
| 7,119,908 B2 | 10/2006 | Nomoto et al. |
| 7,225,734 B2 | 6/2007 | Schanz |
| 7,295,314 B1 | 11/2007 | Spady et al. |
| 2004/0183850 A1* | 9/2004 | Takeuchi et al. ............... 347/19 |
| 2006/0194123 A1 | 8/2006 | Mickan et al. |
| 2007/0253033 A1 | 11/2007 | Johansen et al. |
| 2008/0088809 A1* | 4/2008 | Kosugi et al. ................. 355/27 |
| 2009/0274361 A1 | 11/2009 | Schwab et al. |
| 2010/0065757 A1 | 3/2010 | Schwab et al. |

OTHER PUBLICATIONS

Yang; Automatic Fruit Blemish Detection; Proceedings of 9th Conference on Theory and Application of Image Analysis; Jun. 1995; pp. 381-392; GB.

PCT International Search Report and Written Opinion for corresponding application PCT/US2011/064622.

\* cited by examiner

INFRARED DIRECT ILLUMINATION MACHINE VISION TECHNIQUE FOR SEMICONDUCTOR PROCESSING EQUIPMENT

CROSS-REFERENCE TO RELATED APPLICATIONS

This is a continuation in part of U.S. patent application Ser. No. 12/209,248 filed on Sep. 12, 2008 now U.S. Pat. No. 8,189,194.

STATEMENT REGARDING FEDERALLY SPONSORED RESEARCH OR DEVELOPMENT

Not Applicable

BACKGROUND OF THE INVENTION

1. Field of the Invention

The present invention relates to processes and equipment for manufacturing semiconductors, such as solar cells; and more particularly to apparatus and methods for aligning a component of the manufacturing equipment with a wafer of material on which the semiconductors are being fabricated.

2. Description of the Related Art

Semiconductor devices, such as photovoltaic devices that are commonly called solar cells, are fabricated on a wafer of silicon or other material. Various sections of the wafer are electrically interconnected by a pattern of silver or other conductive material deposited on a surface of the wafer. Because of the relatively large size of the photovoltaic elements, a screen printing process, similar to silk screen printing, typically is employed to deposit the silver in the proper pattern on the wafer surface. The printing screen used in that deposition process must be precisely aligned with the wafer in order that the silver conductive pattern is properly registered with the semiconductor devices.

Unlike the processes for manufacturing other types of semiconductors, such as integrated circuits, the production of photovoltaic devices often is not performed in highly clean conditions. High volume, low cost production techniques and equipment frequently are used. As a result, the manufacturing process may leave a residue on the photovoltaic devices, which would be unacceptable for other types of semiconductors.

Machine vision systems are commonly used in semiconductor device processing. In such systems, a video camera produces an image of the semiconductor wafer and that image is then analyzed for various purposes, such as defect detection. In other situations, the wafer image is utilized to determine whether the wafer is properly positioned on a work surface of a processing apparatus. For example, the registration of the wafer and the printing screen is verified with a camera that produces an image of the wafer with the printing screen there behind.

Difficulty has been encountered when attempting to utilize conventional machine vision systems to align the printing screen used to deposit the conductive pattern on a wafer of photovoltaic devices. Such systems illuminate the wafer. In a direct illumination technique, light is projected from the same side of the wafer as the camera. This technique did not always provide sufficient contrast between the wafer and the printing screen to enable the vision system to reliably and accurately detect the edges of the wafer. Due to the residue on the wafer, both the printing screen and the wafer reflected visible light similarly, which adversely affected the ability to distinguish between those objects. One prior solution used ultra-violet light, however certain types of residues still precluded sufficient contrast between the wafer and the printing screen.

An alternative illumination technique involved backlighting the printing screen, however placing a light source on the side of the printing screen remote from the wafer interfered with the printing process.

As a consequence, it is desirable to develop an alternative technique for illuminating semiconductor wafers when using a machine vision system.

SUMMARY OF THE INVENTION

A vision system is provided to determine a positional relationship between a semiconductor wafer on a platen and an element on a processing machine, such as a printing screen, on a remote side of the wafer from the platen. An aperture extends through the platen underneath an edge of the semiconductor wafer Infrared light from a source impinges upon the semiconductor wafer casting a shadow onto the element adjacent the edge of that wafer.

A camera, positioned beneath the platen, produces an electrical image of the reflected incident light, wherein some of that light was reflected by the wafer. The semiconductor wafer, even one having processing residue, is more reflective to light in the infrared spectrum than the printing screen behind the wafer. The relatively dark shadow adjacent the brightly illuminated semiconductor wafer provides a well-defined dark/light transition in the camera image that enables the wafer edge to be readily detected.

In an illustrative embodiment of the vision system, a filter is located between the semiconductor wafer and the camera to transmit light having infrared wavelengths light while substantially blocking other wavelengths of light from reaching the camera.

DETAILED DESCRIPTION OF THE INVENTION

Although the present invention has particular application for use with equipment for processing photovoltaic device wafers, the vision system has applicability for use in fabricating other types of semiconductor wafers and devices. Furthermore, while the present vision system is being described in the context of an apparatus for printing conductive material on a semiconductor wafer, it can be employed with other kinds of semiconductor fabrication equipment.

Figure 1:
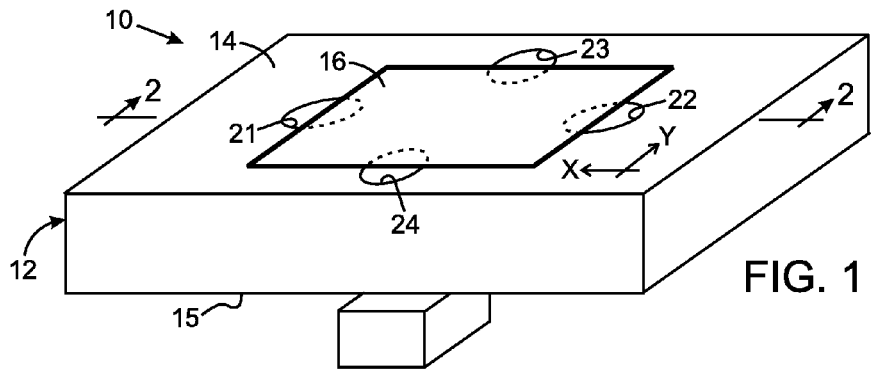
FIG. 1 is an isometric view of part of a printing apparatus showing a platen with a semiconductor wafer thereon.

With initial reference to FIG. 1, an apparatus 10 is employed to apply a conductive pattern of silver to a wafer of semiconductive material in which a photovoltaic device is being fabricated. The apparatus 10 has a platen 12 with a first surface 14 on which the semiconductor wafer 16 is positioned. The exemplary wafer 16 is rectangular, although the present technique can be used with wafers of other shapes by modifying the machine vision system to accommodate such shapes. Four circular viewing apertures 21, 22, 23, and 24 extend through the platen 12 between the opposite first and second surfaces 14 and 15 at the top and bottom of the platen.

In one embodiment, the viewing apertures 21-24 are located so that when the semiconductor wafer 16 is centrally positioned on the first surface 14, edges of the wafer extend across an opening of each viewing aperture 21-24. The semiconductor wafer 16 does not have to be positioned to extend across each aperture opening the same amount, but can be offset on the first surface along either or both of the X and Y orthogonal axes. A rotational offset also may occur. It should be understood that the number, size and positions of the viewing apertures can be varied within the scope of this invention. It should be further understood that depending on the application, each side does not need a separate viewing aperture.

Figure 2:
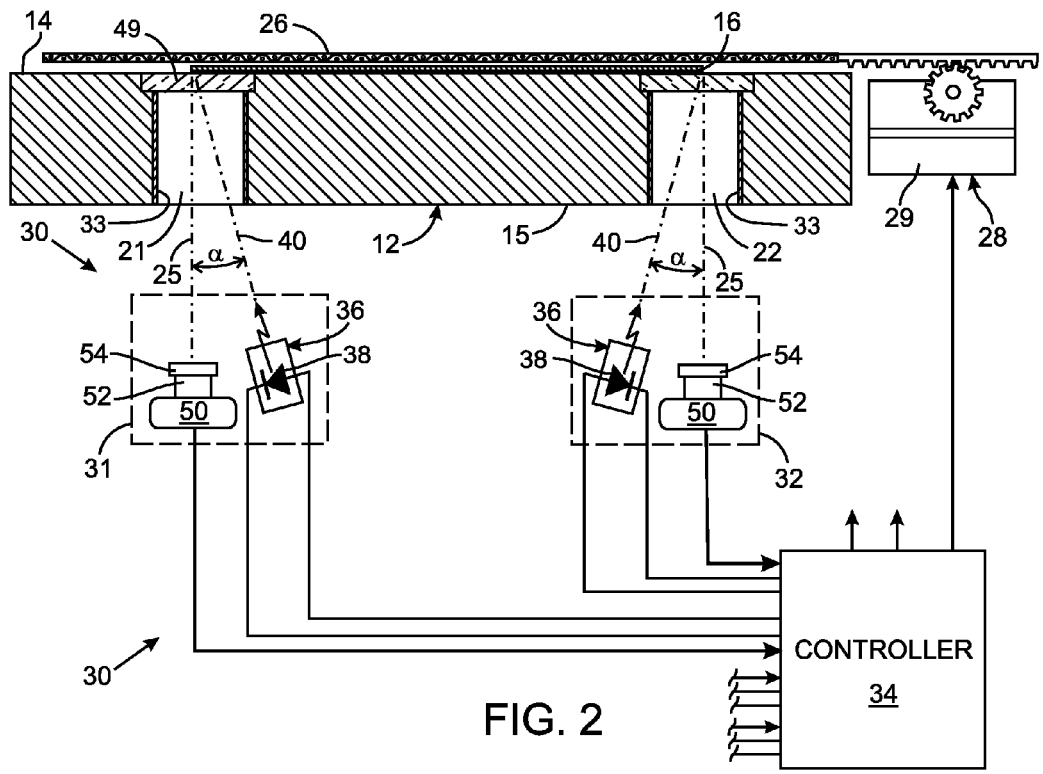
FIG. 2 is a cross sectional view along line 2-2 in FIG. 1 illustrating the platen, the semiconductor wafer, a machine vision system, and a printing screen.

As shown in FIG. 2, after the semiconductor wafer 16 is placed on the first surface 14 of the platen 12, a printing element 26 is positioned against the major surface of the semiconductor wafer 16 that is remote from the platen 12. The printing element 26 is of a type that has been used in previous processes to apply material in a pattern on a wafer surface and include, but is not limited to a printing screen, a stencil, a lithographic mask, or an ink jet head. Nor is the present invention limited to equipment for depositing conductive material on a wafer. The location of the printing element 26 along the X and Y axes, as shown in FIG. 1, is controlled by a positioning mechanism 28 that employs two separate actuators 29 for independently moving the printing element along each axis. A third actuator may be provided to rotate the printing element with respect to the wafer. Only one of those actuators 29 is visible in FIG. 2 and is schematically represented as a motor that drives a rack and pinion mechanism, however, any conventional mechanism for positioning the printing element can be employed.

In an illustrative embodiment, the positioning mechanism 28 is controlled by a machine vision system 30 that utilizes four camera modules, one located beneath each viewing aperture 21-24 in the platen 12. In an illustrative embodiment, the camera modules 31 and 32 associated with the first and second viewing apertures 21 and 22 are illustrated in FIG. 2. The first camera module 31 will be described in detail, with the understanding that the same description applies to the other three camera modules. Each camera module is connected to a conventional machine vision controller 34, which analyzes images received from the four camera modules to determine the position of the printing element 26 with respect to the semiconductor wafer 16. The machine vision controller 34 is a microcomputer based apparatus that executes a software program that operates the camera modules, analyzes generated images, and controls the positioning mechanism 28.

The first camera module 31 is located beneath the first viewing aperture 21 in the platen 12 and includes a light source 36. The interior surfaces of the viewing apertures 21-24 are coated with a layer 33 of anti-reflective material. The light source 36 has a light emitting diode (LED) 38, although other types of light emitters can be used. It is preferred that the LED 38 emits infrared light which has a wavelength in the 700-1000 nm range, and in particular 740 nm or 870 nm. Shorter wavelengths tend to produce weaker reflection from residue on the semiconductor wafer, resulting in weaker contrast against the shadow. Conventional charge coupled device (CCD) and CMOS camera sensors tend to have lower response/sensitivity to longer wavelengths.

The light source 36 produces a collimated light beam 40 that is directed through the first viewing aperture 21 and optionally a window 49 that is flush with the first surface 14 of the platen. In other applications of the present imaging technique the light beam does not have to be collimated. The light beam 40 is directed along a path at an acute angle α, e.g., 18°, to a line that is perpendicular to the surface of the semiconductor wafer 16 that abuts the platen, however other angles may be used. Also, the light source could be positioned differently relative to the viewing aperture, and the light path bent, using methods in the art, such that the light path terminates at the acute angle to a line that is perpendicular to the surface of the semiconductor wafer 16.

Figure 3:
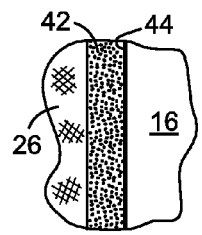
FIG. 3 shows a portion of an edge of the semiconductor wafer and the adjacent area of the a printing screen.

With reference to FIG. 3, directing the light beam 40 at angle α casts a shadow 42 of the semiconductor wafer 16 onto the printing element 26 adjacent the edge 44 of that wafer. The relatively dark shadow 42 next to the brightly illuminated semiconductor wafer 16 provides significant light/dark illumination contrast at the wafer's edge 44. Some semiconductor wafers, especially those used for photovoltaic devices are very light absorbing and creating a shadow allows use of a very intense light source to brightly illuminate the wafer and overcome the light absorption. Furthermore, semiconductor wafers, that have residue from other processing steps, absorb shorter wavelengths in the visible and ultraviolet ranges to a greater degree that infrared light.

Referring again to FIG. 2, the first camera module 31 also includes a conventional CCD or a CMOS camera 50. The camera 50 has a lens 52 aimed upward through the first viewing aperture 21 and thus at the surface of the semiconductor wafer 16 that abuts the platen 12. In an illustrative embodiment, a narrow band-pass filter 54 is located between the lens 52 and the semiconductor wafer 16. The pass-band of the filter 54 includes the wavelength of the infrared light from the source 36, but excludes ambient light wavelengths. Specifically, the band-pass filter 54 blocks a significant portion of the visible light in the environment of the semiconductor processing apparatus 10 from entering the camera 50. Thus the camera 50 principally receives infrared light and primarily the light produced by the source 36.

During fabrication, the semiconductor wafer 16 is placed onto the first surface 14 of the platen 12. The controller 34 then activates the light sources 36 in the four camera modules 31 associated with the viewing apertures 21-24 in the platen. Alternatively, the light sources 36 can be supplied with electricity via a manual switch, that is not operated by the controller 34. Operation of the first camera module 31 will be described with the understanding that the same operation occurs in the other three camera modules.

In an illustrative embodiment, the activation causes the respective light sources 36 to emit the collimated infrared light beam 40 which passes through the associated viewing aperture 21 and onto portions of the semiconductor wafer 16 and the printing element 26 that extend over that viewing aperture 21. Thus areas of the semiconductor wafer 16 and the printing element 26 are brightly illuminated. As noted above, the angle α at which the light beam 40 is directed casts a shadow onto the printing element 26 which highlights the edge of the wafer 16 due to the sharp light/dark contrast. This makes the edge more distinguishable in the image produced electrically by the camera 50 than if the light was directed perpendicular to the surface of the semiconductor wafer 16.

Portions of the lower surface of the printing element adjacent the edge of the semiconductor wafer 16 contain one or more fiducial markers that have a distinctive design and recognizable orientation. Those portions of the printing element are not used for printing a conductive pattern on the wafer. These fiducial markers in the camera's electrical image indicate the positional relationship of the printing element 26 with respect to the edge 44 of the semiconductor wafer 16.

Some of the infrared light that is reflected back into the viewing aperture 21 by either the printing element 26 or the semiconductor wafer 16 and travels downward into the camera 50. Specifically the reflected light is transmitted by the narrow band-pass filter 54 which also has a coating that is anti-reflective to the infrared wavelengths produced by the light source 36.

The infrared light entering the camera 50 enables that device to produce an electrical image of the wafer and the adjacent portion of the printing element 26. In one embodiment, that image is conveyed to the controller 34 along with the images from the other three camera modules associated with the other viewing apertures 22-24 in the platen 12. The controller 34 then employs conventional machine vision techniques to determine the positions of the semiconductor wafer 16 and the printing element 26 relative to one or more of the viewing apertures 21-24 and uses those collective positions to determine the orientation of the printing element 26 with respect to the semiconductor wafer 16. The controller 34 then activates the positioning mechanism 28 to move the printing element 26 along the X and Y axes as necessary to properly position the printing element over the semiconductor wafer 16 in order to print a conductive pattern that is properly registered with the photovoltaic devices. In addition, the relative position of the edges of the semiconductor wafer in the images from two cameras on opposite sides of that wafer and the spacing between the cameras can be used to determine the size of the wafer.

The foregoing description was primarily directed to a preferred embodiment of the invention. Although some attention was given to various alternatives within the scope of the invention, it is anticipated that one skilled in the art will likely realize additional alternatives that are now apparent from disclosure of embodiments of the invention. Accordingly, the scope of the invention should be determined from the following claims and not limited by the above disclosure.

The invention claimed is:

1. A vision system for determining a positional relationship between a semiconductor wafer and an element for processing the semiconductor wafer, wherein the semiconductor wafer is on a platen that has an aperture there through and the element is located on a remote side of the semiconductor wafer from the platen, said vision system comprising:
    a source of infrared light, for directing a beam of infrared light through the aperture in the platen at an acute angle to a line that is perpendicular to a surface of the semiconductor wafer to illuminate the semiconductor wafer to cast a shadow onto the element adjacent an edge of the semiconductor wafer; and
    a camera for electrically acquiring an image of reflected incident infrared light, wherein at least some of the reflected infrared light was reflected by the semiconductor wafer.

2. The vision system as recited in claim 1 wherein the source produces a collimated light beam.

3. The vision system as recited in claim 1 wherein the source produces infrared light having a wavelength between 700 nm and 1000 nm.

4. The vision system as recited in claim 1 wherein the source produces infrared light having a wavelength that is either 740 nm or 870 nm.

5. The vision system as recited in claim 1 further comprising a filter located between the semiconductor wafer and the camera, wherein the filter is transparent to the infrared light.

6. The vision system as recited in claim 1 further comprising a window of material that is transparent to the infrared light and that is located in the aperture in the platen.

7. The vision system as recited in claim 1 wherein walls of the aperture in the platen have an anti-reflective material thereon.

8. A vision system for determining a positional relationship between a semiconductor wafer and an element for processing the semiconductor wafer, wherein the semiconductor wafer is on a platen that has an aperture there through and the element is located on a remote side of the semiconductor wafer from the platen, said vision system comprising:
    a source which emits an infrared light beam that is directed at an acute angle to a line that is perpendicular to a surface of the semiconductor wafer, thereby illuminating the semiconductor wafer to cast a shadow onto the element adjacent an edge of the semiconductor wafer; and
    a camera for producing electrically an image from infrared light received from the aperture in the platen, wherein the edge of the semiconductor wafer is defined in the image by a dark/light transition.

9. The vision system as recited in claim 8 wherein the source produces infrared light having a wavelength between 700 nm and 1000 nm.

10. The vision system as recited in claim 8 wherein the source produces infrared light having a wavelength that is either 740 nm or 870 nm.

11. The vision system as recited in claim 8 wherein walls of the aperture in the platen have an anti-reflective material thereon.

12. The vision system as recited in claim 8 further comprising a filter located between the platen and the camera, wherein the filter is transparent to the infrared light.

13. The vision system as recited in claim 8 wherein the infrared light beam is collimated.

14. A method for determining a positional relationship between a semiconductor wafer on a platen and an element for processing the semiconductor wafer that is on a remote side of the semiconductor wafer from the platen, said method comprising:
    emitting infrared light from a source;
    directing the infrared light through an aperture in the platen to illuminate the semiconductor wafer, wherein the infrared light is directed at an acute angle to a line that is perpendicular to a surface of the semiconductor wafer; thereby illuminating the semiconductor wafer to cast a shadow onto the element adjacent an edge of the semiconductor wafer; and
    employing a camera to produce electrically an image from infrared light received from the aperture in the platen, wherein at least some of that received infrared light has been reflected by the semiconductor wafer.

15. The method as recited in claim 14 wherein the infrared light has a wavelength between 700 nm and 1000 nm.

16. The method as recited in claim 14 wherein the infrared light has a wavelength that is either 740 nm or 870 nm.

17. The method as recited in claim 14 further comprising providing a filter which blocks non-infrared light from entering the camera.

18. The method as recited in claim 14 further comprising covering walls of the aperture in the platen with an anti-reflective material.

19. The vision system as recited in claim 14 wherein emitting infrared light from a source produces a collimated light beam.

* * * * *